United States Patent [19]

Ohtuka et al.

[11] Patent Number: 5,005,113
[45] Date of Patent: Apr. 2, 1991

[54] HYBRID CIRCUIT MODULE HAIVNG BRIDGE CIRCUIT AND RECTIFYING CIRCUIT DISPOSED ON A SAME SUBSTRATE

[75] Inventors: Nobuo Ohtuka, Oizumi; Kouichi Matsumoto, Kumagaya, both of Japan

[73] Assignee: Sanyo Electric Co., Ltd., Osaka, Japan

[21] Appl. No.: 433,773

[22] Filed: Nov. 9, 1989

Related U.S. Application Data

[62] Division of Ser. No. 271,302, Nov. 15, 1988, Pat. No. 4,918,590.

[30] Foreign Application Priority Data

Nov. 16, 1987 [JP] Japan ............................... 62-288779
Nov. 16, 1987 [JP] Japan ............................... 62-288800

[51] Int. Cl.⁵ ..................... H02M 5/45; H02M 5/458
[52] U.S. Cl. ...................................... 363/37; 363/132; 363/136
[58] Field of Search ................... 363/132, 136, 37, 41, 363/98

[56] References Cited

U.S. PATENT DOCUMENTS

| 4,424,557 | 1/1984 | Steigerwald | 363/41 |
| 4,482,946 | 11/1984 | Bhagwat | 363/136 |
| 4,485,434 | 11/1984 | Beeston et al. | 363/132 |
| 4,489,371 | 12/1984 | Kernick | 363/41 |
| 4,670,833 | 6/1987 | Sachs | 363/132 |
| 4,709,317 | 11/1987 | Iizuka et al. | 363/37 |
| 4,918,590 | 4/1990 | Ohtuka et al. | 363/37 |

FOREIGN PATENT DOCUMENTS

| 3109750 | 9/1982 | Fed. Rep. of Germany | 363/132 |
| 41729 | 4/1978 | Japan | 363/132 |
| 62-42472 | 9/1987 | Japan |  |

Primary Examiner—William H. Beha, Jr.
Attorney, Agent, or Firm—Wenderoth, Lind & Ponack

[57] ABSTRACT

An inverter circuit includes fast transistors for PWM and slow switching thyristors for a fundamental frequency. The inverter circuit further includes a rectifying circuit for rectifying an input AC power and a bridge circuit. The bridge circuit includes a plurality of bridge circuit arms, each of the bridge circuit arms constituted by connecting a collector terminal of a transistor to a cathode terminal of a thyristor. An emitter of the transistor is connected to a negative side of the rectified output of the rectifying circuit, and an anode of the thyristor is connected to a positive side of the rectified output of the rectifying circuit.

1 Claim, 9 Drawing Sheets

| MODE | I | II | III | IV |
|---|---|---|---|---|
| PC(A) | ON | ON | OFF | OFF |
| PC(B) | OFF | OFF | ON | OFF |
| PC(C) | OFF | OFF | ON | ON |
| PC(D) | ON | OFF | OFF | OFF |

| Hz | m | n | $T_0$(ms) | $T_1$(ms) |
|---|---|---|---|---|
| 60 | 3 | 4 | 3.3 | 40 |
| 40 | 4 | 6 | 7.3 | 38 |
| 30 | 5 | 7 | 9.3 | 37 |
| 24 | 6 | 9 | 19.3 | 34 |
| 20 | 7 | 10 | 23.3 | 30 |

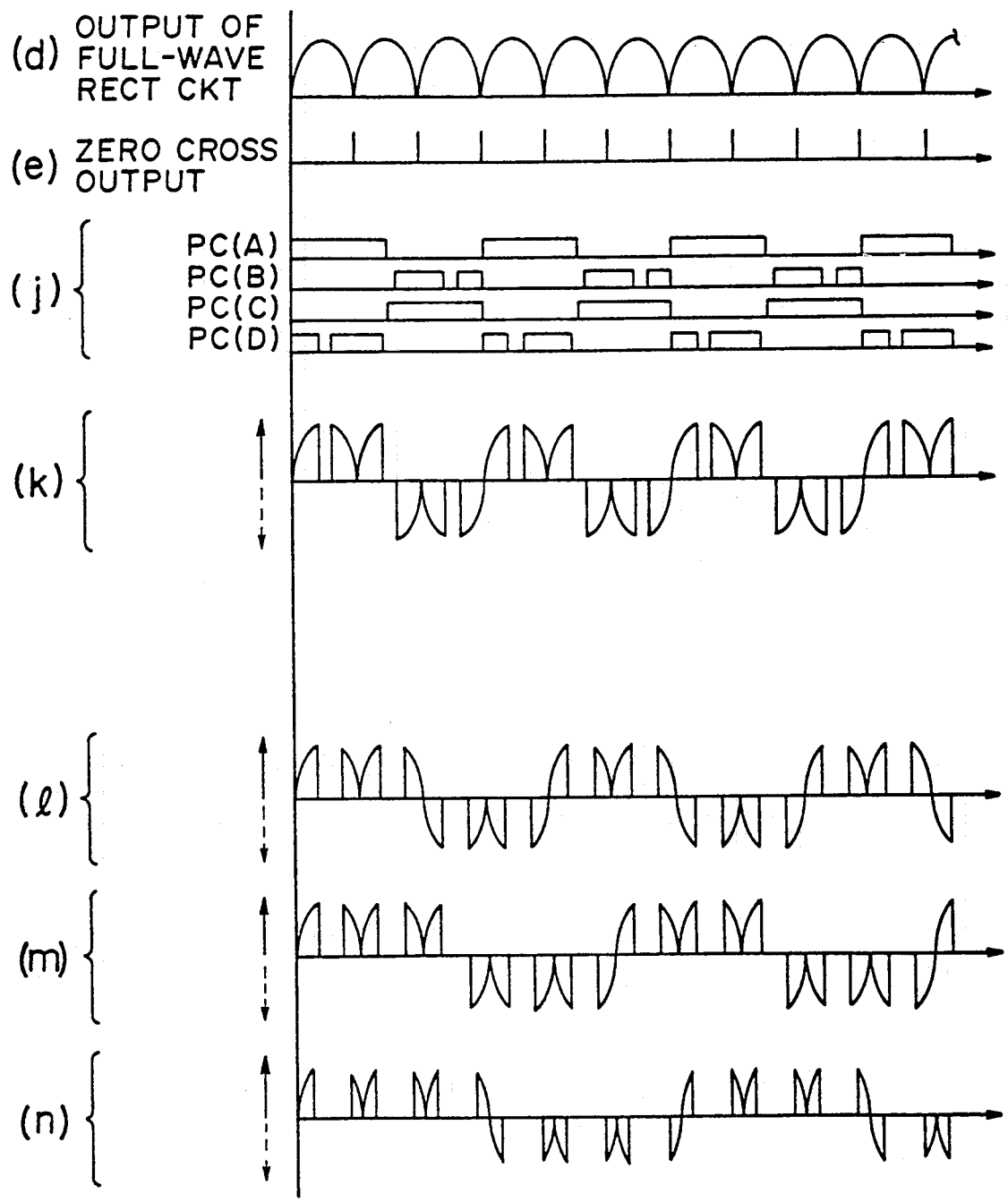

HYBRID CIRCUIT MODULE HAIVNG BRIDGE CIRCUIT AND RECTIFYING CIRCUIT DISPOSED ON A SAME SUBSTRATE

This is a Divisional Application of application Ser. No. 07/271,306, filed Nov. 15, 1988, now U.S. Pat. No. 4,918,590 issued Aug. 17,1990.

BACKGROUND OF THE INVENTION

The present invention relates in general to a hybrid electrical circuit and, more particularly, to a hybrid electric circuit device for supplying electric power of a desirably controlled frequency to a load such as an electric motor, which is applicable, for example, to a frequency conversion circuit.

The present invention also relates to a frequency conversion circuit, and is particularly concerned with an output circuit thereof.

Generally, a prior art frequency conversion circuit is known as disclosed in Japanese Patent Publication No. 62-42472, published Sept. 8, 1987. The circuit described in the aforementioned publication includes circuit switching elements for changing the direction in which a pulsating current is carried, each constituting thyristor elements, whereby a desired frequency is obtained from controlling an ignition timing of the thyristors.

Such prior art comprises a single thyristor module containing a plurality of thyristors for directly controlling power principally, a single diode module containing a plurality of diodes for rectification, a drive circuit for the thyristors, and an ignition timing control circuit of thyristors.

Since an ON/OFF characteristic of the thyristor is utilized, the prior art has a characteristic that the circuit automatically becomes off at the zero cross time of an impressed pulsating current. Accordingly, the direction of an electrical current to the load is changed generally at the zero cross point, a frequency of the alternating current generated from the frequency conversion circuit becomes one of the integral number of a frequency of the utilized AC power, and thus a continuity at the time of frequency variation is not satisfactory, an abnormal vibration arises on a load, or the load gets locked otherwise.

Meanwhile, in the case where the frequency conversion circuit is constituted of transistor elements, an arbitrary frequency can be generated, however, an ON/OFF control circuit and an independent power source for control will be necessary at every transistor element, and thus the circuit becomes inevitably large in size and complicated at the same time, and the thyristor module and the diode module are connected by a lead wire or wiring pattern. Accordingly, a pulsating current of large power flows to the lead wire or wiring pattern, and an significant electromagnetic noise is radiated from the lead wire or wiring pattern, thus causing a noise interruption in a TV, audio equipment and other such devices. Then, since the thyristor module and the diode module are separated from each other, the circuit size becomes large, and a troublefree a low cost operation is therefore not realized for the circuit.

SUMMARY OF THE INVENTION

In view of such problems, an object having a present invention to provide a frequency conversion circuit simple configuration and capable of providing an arbitrary frequency, and is to further provide a frequency conversion circuit which achieves realizing miniaturization and enhancement of reliability using a circuit comprising thyristors, transistors and rectifier diodes.

Another object of the invention is to provide a hybrid electrical circuit device having a printed circuit base molded integrally with plastic material.

The present invention provides an electric circuit for supplying controlled frequency electric power to a load comprising: thyristors, each having a gate terminal for supplying an electric current from its anode terminal to its cathode terminal; transistors each having a gate terminal for switching ON/OFF an electric current from its collector terminal to its emitter terminal; series circuit means connected between the cathode terminal of the thyristor and the collector terminal of the transistor; a bridge circuit having a plurality of arms between terminals of an electric power source so that one terminal and the other terminal are coupled to the anode terminal of the thyristor and the emitter of the transistor, respectively. A controlling circuit device is provided to supply an electric signal to the gate terminal of the thyristors and supplying an electric signal to the base terminal of the transistor to supply an electric current periodically to the load in accordance with the desired frequency. The transistor repeatedly provides an ON/OFF state while the thyristor is in an ON state.

The present invention provides also an electric circuit for supplying a single-phase electric power which permits miniaturization and enhancement of the reliability by thyristors, transistors and rectifier diodes.

Also, the present invention provides a hybrid circuit device for supplying electric power to a load comprising: printed circuit base means, molded integrally with plastic resin, for supplying electric power to the output terminals, a plurality of switching semiconductors forming a bridge circuit and adapted to provide ON/OFF switching operation to supply electric power of a desired frequency; and a plurality of rectifier diodes for rectifying the AC power and then feeding the rectified power to the switching semiconductors. The bridge circuit can have arms each of which has a thyristor and a transistor connected in series to the thyristor. Alternatively, the bridge circuit can be formed with arms each having two transistors that are connected together in series In an embodiment, the sensor is provided to sense temperature of the switching semi-conductors.

In the molded structure described above, a radiation of electromagnetic noise will be prevented by shortening a lead wire or wiring pattern through which a large current flows, and the circuit can also be miniaturized as a whole.

In the single-phase frequency conversion circuit constructed as above, a radiation of electromagnetic noise will be prevented by shortening a lead wire or wiring pattern through which a large power flows, and the circuit can also be miniaturized as a whole.

BRIEF DESCRIPTION OF THE DRAWINGS

FIGS. 9(d)-(n) are diagrams illustrating the case where another frequency output is obtained.

DETAILED DESCRIPTION OF PREFERRED EMBODIMENTS

The present invention will be described with reference to the accompanying drawings representing preferred embodiments thereof. The illustrated embodiments merely shows preferred embodiments of the invention and directed to a single-phase conversion circuit for the purpose of clarification only, but the present invention is not limited to the description of the preferred embodiments.

Figure 1:
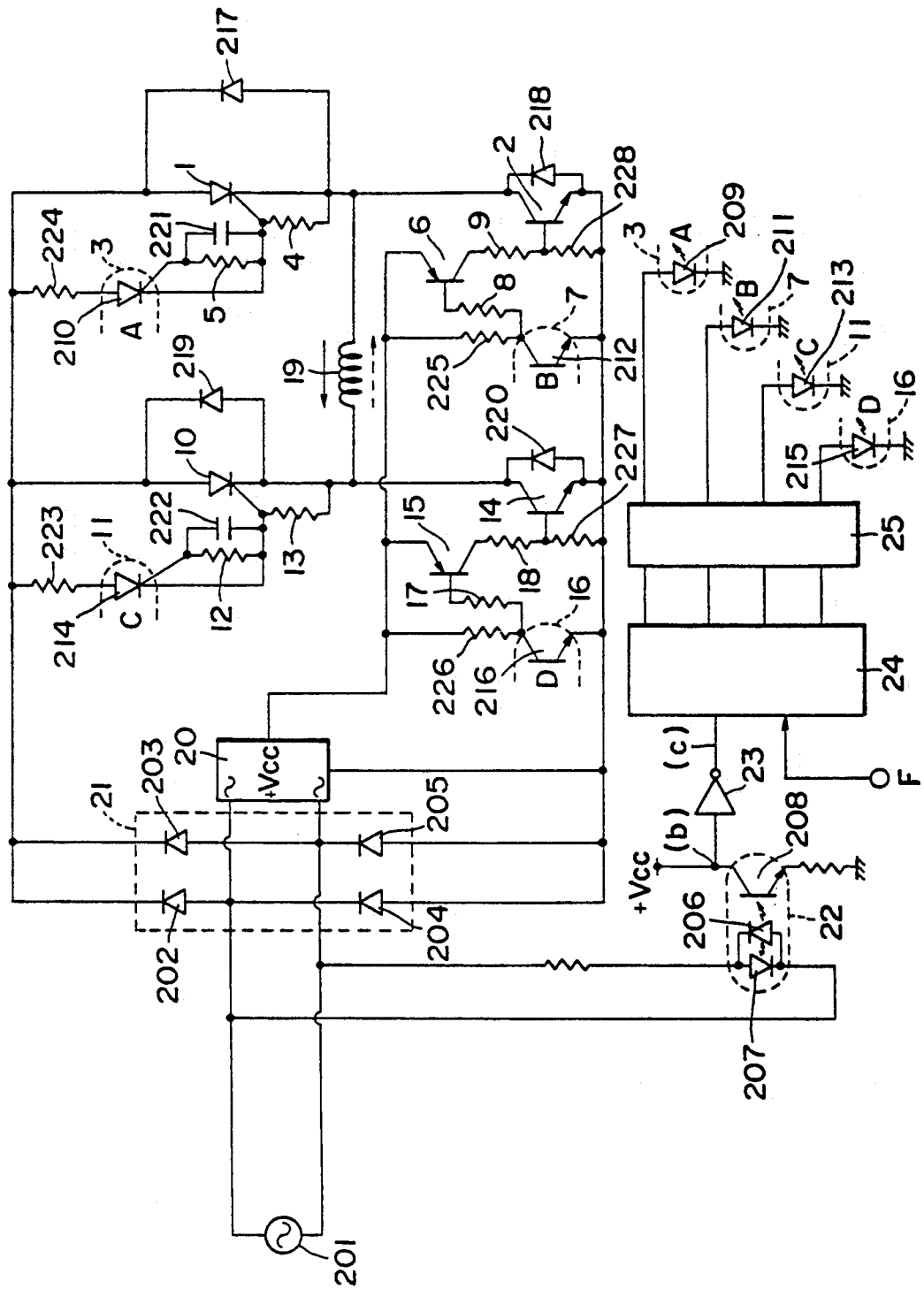
FIG. 1 is a frequency conversion circuit diagram embodying the present invention, FIGS. 2a to 2f diagrams illustrating the case where a 60 Hz output is obtained using the circuit shown in FIG. 1, FIGS. 3a to 3c are diagrams illustrating a zero cross output.

Referring first to FIG. 1 showing an electronic circuit of a main part of a single-phase conversion circuit, a thyristor 1 has a cathode terminal connected to a collector terminal of a transistor 2. An ignition circuit having a photo-coupler 3 is provided on a gate terminal of the thyristor 1. The thyristor 1 and the photo-coupler 3 are connected to self-bias resistors 4 and 5, respectively. A bias circuit having a driving transistor 6 and a photo-coupler 7 is provided on a base terminal of the transistor 2. The transistors 2 and 6 are connected at their base terminals with base resistors 9 and 8, respectively. A thyristor 10, similar to the thyristor 1, has an ignition circuit having a photo-coupler 11 on a gate terminal of the thyristor 10. The thyristor 10 and the photo-coupler 11 are connected with self-bias resistors 13 and 12, respectively. A transistor 14, similar to the transistor 2, is connected at its base terminal with a bias circuit having a driving transistor 15 and a photo-coupler 16. The transistors 14 and 15 are connected at their base terminals with base resistors 18 and 17, respectively The thyristors 1, 10 and the transistors 2, 14 are maintained in an ON state when the photo-couplers are in an ON state.

A single-phase load 19 or, for example, a single-phase electric motor and the like, has one end connected to a connection point between the cathode terminal of the thyristor 1 and the collector terminal of the transistor 2, and the other end connected to a connection point between a cathode terminal of the thyristor 10 and a collector terminal of the transistor 14.

A constant voltage circuit 20 is provided to generate +Vcc voltage, which is supplied to the transistors 6, 15 and the photo-couplers 7, 16. The constant voltage circuit 20 has a rectifying part, a smoothing part and a stabilizing part, not shown.

A rectifying circuit 21 has four rectifying diodes 202, 203, 204, 205 connected in the form of a full bridge A pulsating voltage rectified by the rectifying circuit 21 is impressed between anode terminals of the thyristors 1, 10 and emitter terminals of the transistors 2, 14.

A two-way photo-coupler 22 is connected between the output terminals of a utilized AC power source 201. An output of the photo-coupler 22 is as illustrated by the item "(b)" when the operating voltage of a light emitting diode(LED) 206, 207 used on a photo transistor is taken into consideration, whereas the item (a) represents an output waveform of the utilized AC source. An output for which the output waveform is inverted by an inverter 23, that is, waveform shown in the item "(c)", is fed to a controlling part 24 (i.e., microcomputer or the like). The output corresponds to a zero cross output of the utilized AC power source.

The controlling part 24 controls a frequency of the power fed to the load 19 according to a frequency signal incoming from a terminal F, lighting up the photo thyristors 209, 210, photo transistors 211, 212, and photo thyristors 213, 214 of the photo-couplers 3, 7, 11 and 16 through a buffer 25 to determine an output frequency. Reference numerals 217–220 denote reverse-blocking diodes, reference numerals and 221 and 222 denote capacitors.

Figure 2:
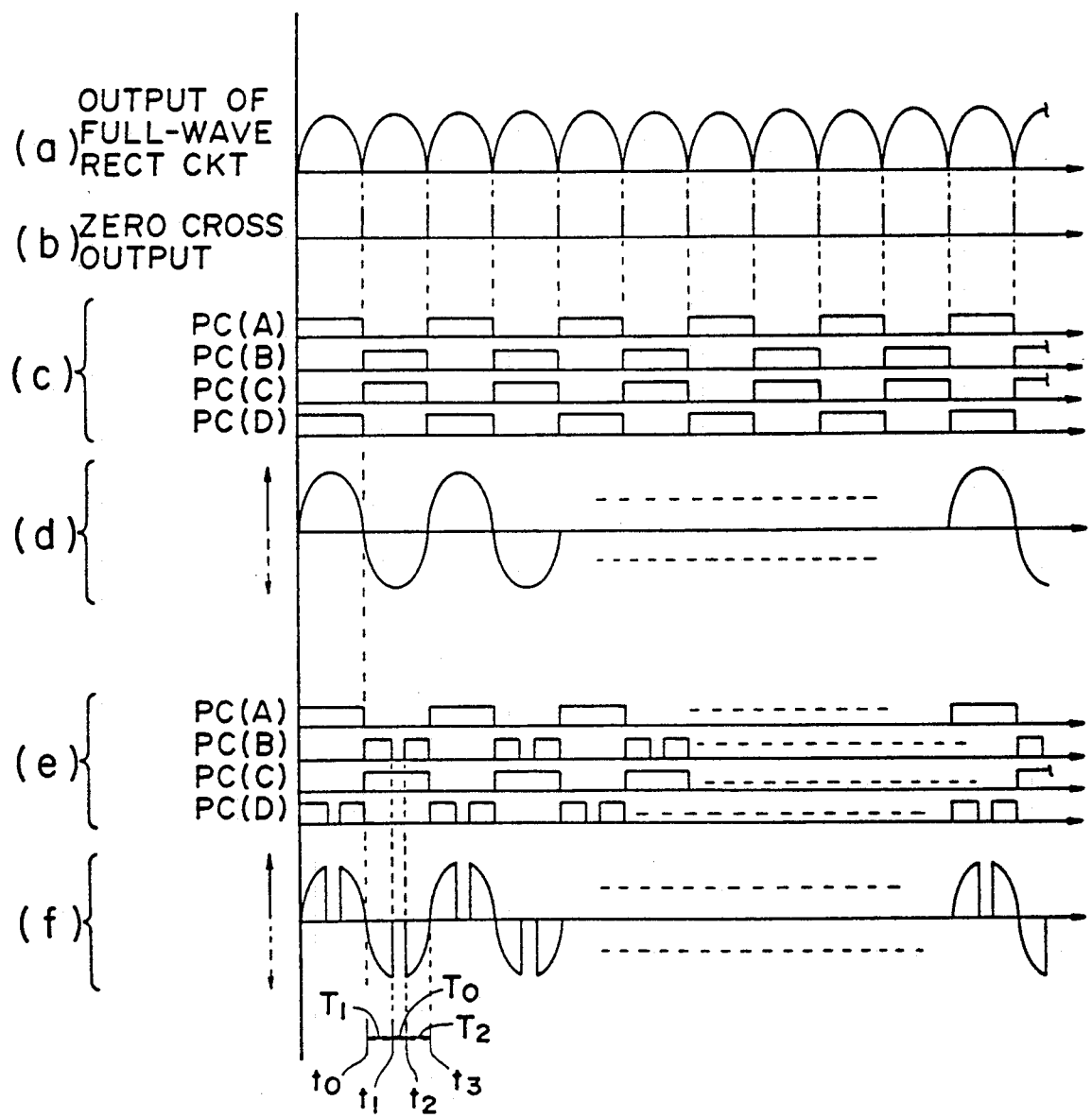
Figure 3:
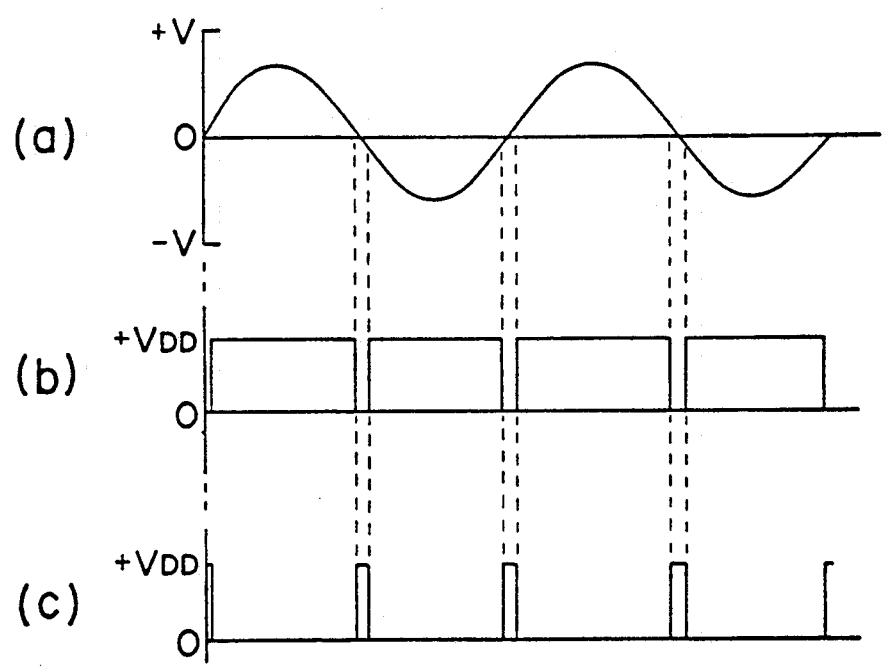

In FIG. 2 of the drawings (a) shows that pulsating current output of the rectifying circuit 21, (b) shows the zero cross output of the AC power source, (c) shows the ON outputs of the photo-couplers (A)3, (B)7, (C)11, (D)16 for obtaining the 60 Hz output, and (d) shows the voltage impressed on the load 19. The arrow shows in full line and that shown in dotted line in (d) depict the directions of the voltage impressed so as to carry an electric current in the directions indicated by the arrow shown in full line and that shown in dotted line of the load 19 shown in FIG. 1, respectively. That is, an electric current flows in the directions indicated by arrows in FIG. 1 when a voltage is impressed in the directions indicated by arrows in FIG. 2. Accordingly, when obtaining the 60 Hz output, the direction in which an electric current is carried may be changed according to the zero cross output shown in (d). In this case, a voltage which is the same as a rated voltage of the AC power source is impressed on the load.

In FIG. 2, (e) and (f) show the changing of a mean voltage impressed at 60 Hz in output frequency, wherein an impression of the voltage is interrupted T Time after ($t_1$) a zero crossing time ($t_0$), and further impression of the voltage is recommenced T time thereafter ($t_2$). For impressing such a voltage waveform, an ON/OFF operation of the photo-coupler (B) (transistor 2) will be controlled to the times $t_0$, $t_1$, $t_2$, $t_3$ with the photo-coupler (C) (thyristor 11), for example, kept on. The period of time $T_1+T_2+T_3$ covers a half cycle of 60 Hz, and $T_1=T_2$ in this case. Accordingly, the time between $T_1$ and $T_2$ may be set on characteristics such as efficiency, output and the like of the load 19.

Accordingly, the controlling part 24 comprises controlling ON states of the photo-couplers (A)3, (B)7, (C)11, (D)16 so as to obtain output waveforms shown in FIG. 2 (see also FIG. 1).

In the conversion circuit constructed as above, the full-wave rectifying circuit 21, the thyristors 1, 10 and the transistors 2, 14 are contained within the device 27, and the length of the wiring pattern for connecting the rectifying circuit 21 and the thyristors 1, 10 or the transistors 2, 14 can be made shorter Accordingly, an effective length that the wiring pattern functions as an antenna becomes short, thus decreasing the radiation of electromagnetic noise. Further, a use of the device may realize a compaction of the circuit and thus a miniaturization of the conversion circuit.

In the above-described embodiment of the invention, by molding the rectifier element and the plurality of switching elements integrally, an effective length in which the wiring or wiring pattern for connecting the rectifier element and the switching elements functions as an antenna can be shortened, a radiation of electromagnetic noise due to a carried pulsating current will be suppressed, and thus an influence to be exerted on other electronic equipment can be suppressed. Further, by using such a device, space utilized can be lessened, and the electric circuit can be miniaturized as a consequence.

An example of the conversion according to the invention will be described specifically. The following description is subject to the frequency of a utilized AC power source being set into five stages at 60 Hz, 40 Hz, 30 Hz, 24 Hz and 20 Hz.

Figures 4, 5, 8:
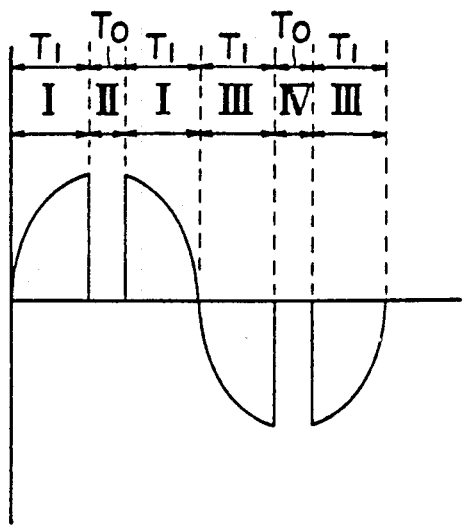
FIG. 4 is an enlarged diagram showing an output waveform in one cycle.
FIG. 5 is a diagram showing the ON/OFF state of a photo-coupler at each operation mode.
FIG. 8 is a diagram showing constant data of the output frequency.
Figure 6:
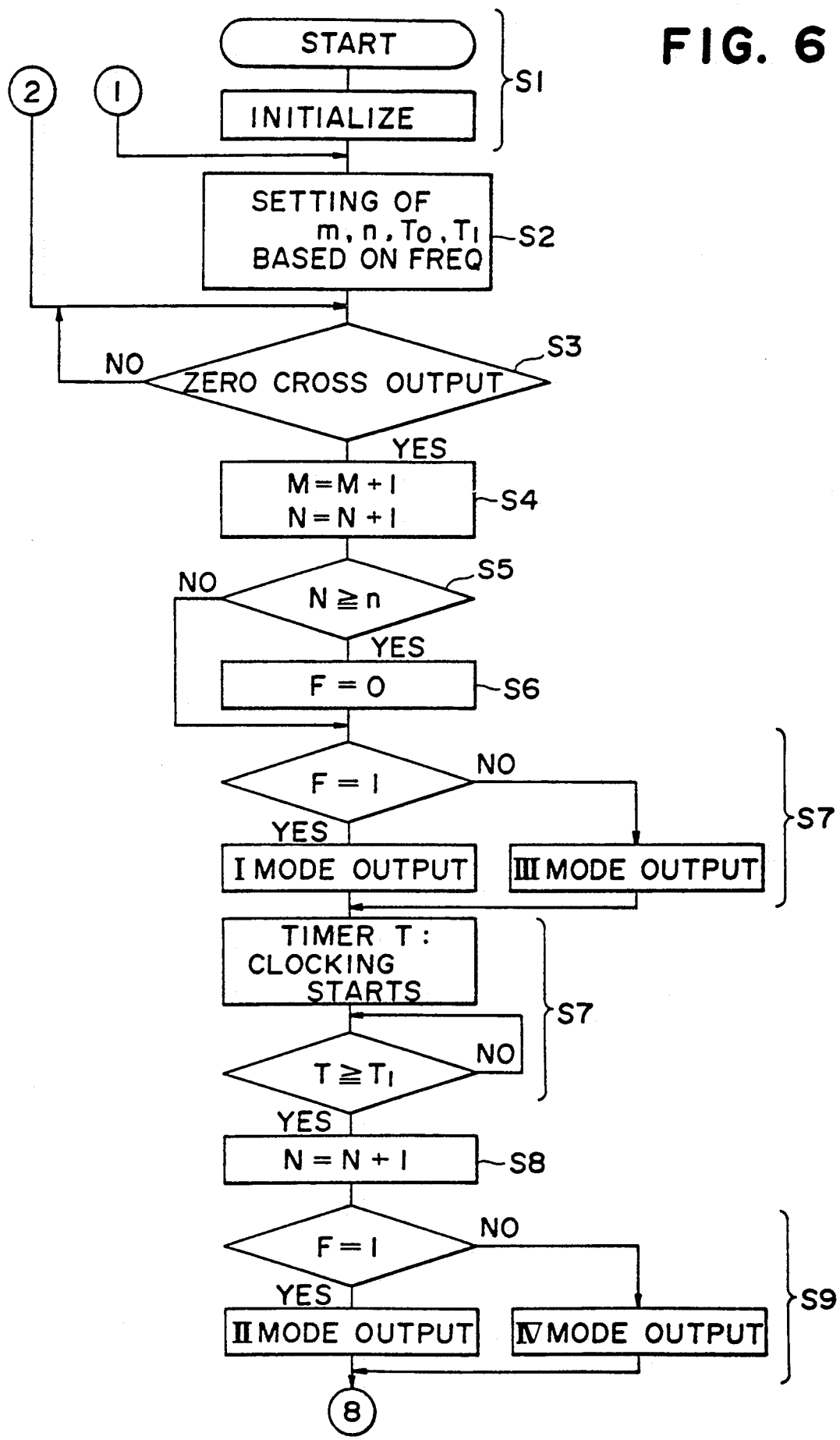
FIGS. 6 and 7 are operational flow charts of the main operation of the controlling part shown in FIG. 11.
Figure 7:
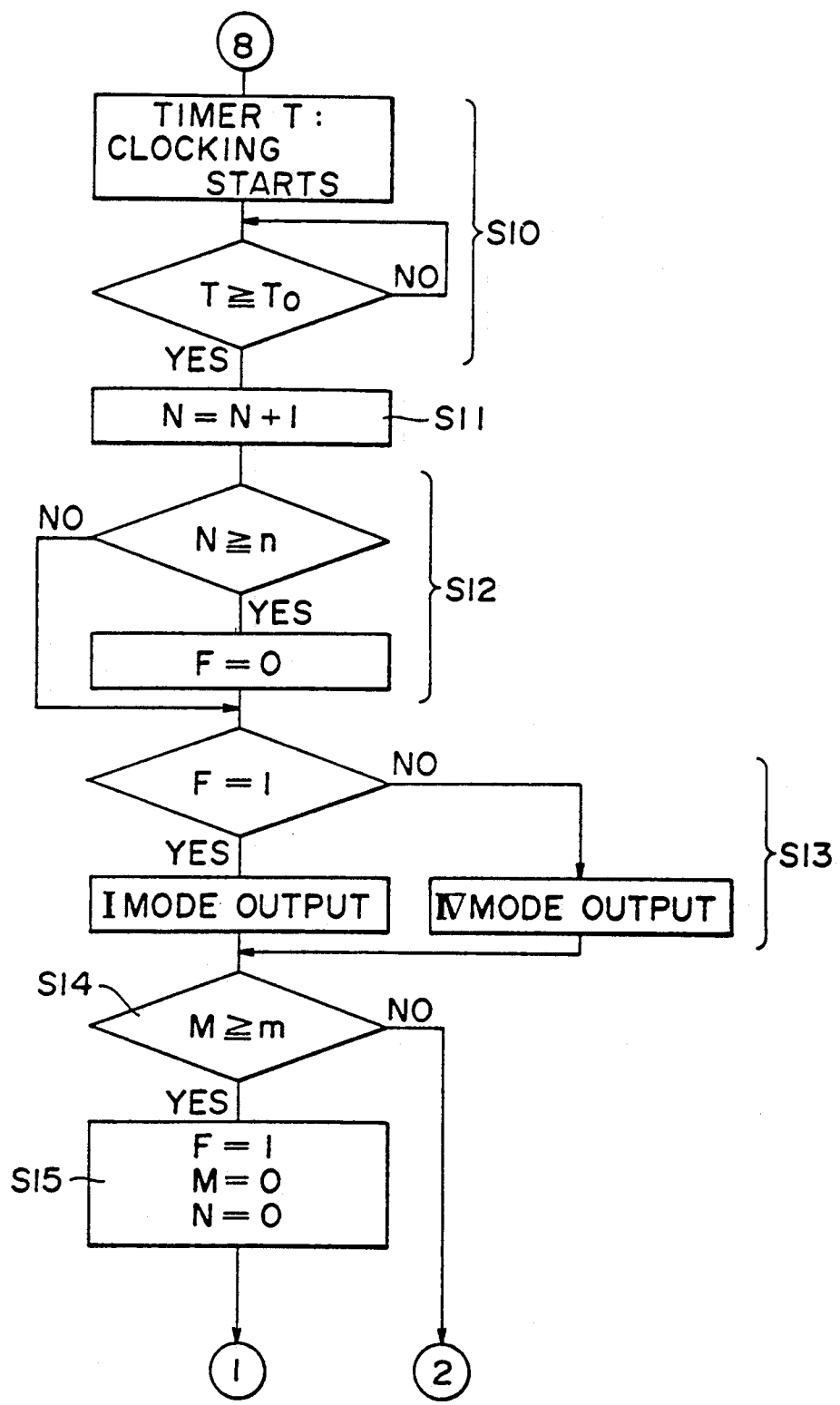
Figure 11:
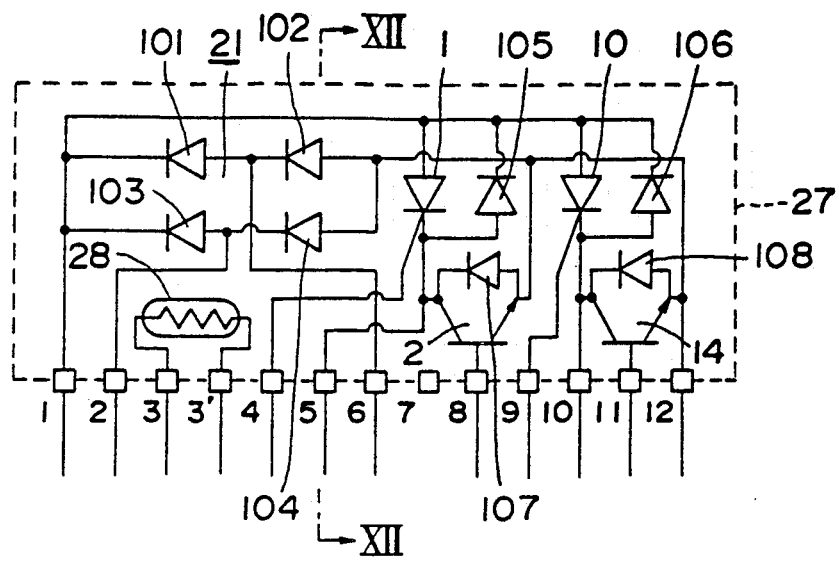
FIG. 11 is a hybrid circuit diagram of a molded device to a conversion circuit according to the present invention.

FIGS. 6 and 7 are operational flow charts for obtaining the aforementioned outputs, namely operational flow charts of the controlling part 24 shown in FIG. 11. FIG. 8 represents data at each frequency, wherein a mean voltage impressed on the load is determined according to time $T_0$, $T_1$, a reference character "m" represents a count number of zero cross output indicating an end of one period, and "n" represents a count number of the mode in a half period. That is, the direction in which an electric current is carried to a load is transferred from the direction indicated by the arrow shown in full line to that of the arrow shown in dotted line when "n" reaches a predetermined count number, and the current carrying direction is transferred from the direction indicated by the arrow shown in dotted line to that of the arrow shown in full line when "m" reaches a predetermined count number. Thus, the end of one period is detected on the count number of zero cross output, therefore the frequency can be changed in accordance with the zero cross output at all times.

First, starting and constant setting are carried out at step $s_1$ (F=1, M=1, N=0). A frequency signal applied to the terminal F is supplied at step $S_2$, and data (m, n, $T_0$, $T_1$) according to the frequency is read from the table of FIG. 8. Next, a presence of the zero cross output is detected at step $S_3$ so that a first mode output in the half cycle can be synchronized with the zero cross output at all times. When the zero cross output is present, "1" is added to M and N to shift the next mode, and a new half cycle starting is set at step $S_4$. Next, whether "N≧n" is determined at step $S_5$. That is, whether the output waveform is on the side of the arrow shown in full line (positive output) or on the side of the arrow shown in dotted line (negative output) is decided, and when "N≧n", the flag is rewritten to F=0 (indicating negative output) at step $S_6$. Accordingly, I mode output (positive output) or III mode (negative output) is decided to a value of the flag and then so generated. The output is maintained for the time $T_1$ thereafter at step $S_7$. Whenever the time is up, "1" is added as N=N+1 at step $S_8$ to the next mode output. Whether the next mode is II mode (positive output) or IV mode (negative output) is determined at step $S_9$ and so generated. The output is maintained for the time $T_0$ thereafter at step $S_{10}$. After the time is up, "1" is added as N=N+1 at step $S_{11}$ to the next mode output. Whether or not "N≧n", that is, whether or not the output is changed to a negative output is determined at step $S_{12}$ in this case, and if "N≧n", then "F=0". Whether I mode output (positive output) or III mode (negative output) is decided thereafter at step $S_{13}$ and so generated. Next, "M≧m", that is, whether or not the output for one period ends at the last mode of half cycle is decided at step $S_{14}$, and when the output for one period is finished, F,M and N are determined as F=1, M=0, and N=0 at step S15 to return to step $S_2$, and when not yet finished, the mode output decided at $S_{13}$ is kept until the time is up on the zero cross output at $S_3$.

In the above-described embodiment, whether the output is positive or negative is decided at the first and last modes of half cycle, and whether or not the output for one period ends is decided at each last mode of the half cycle, however, the case where the output frequency is set to other frequency than the above-mentioned embodiment is not necessarily limited thereto.

FIG. 9 is a diagram showing a state when a 40 Hz output is obtained, wherein the 40 Hz output frequency (60/1.5=40 Hz) is obtainable from carrying the latter half pulsating current second from the left in the direction indicated by an arrow in dotted line, that is, making a half cycle of the output waveform 1.5 times. ON states of the photo-couplers (A), (B), (C), (D) in this case may be controlled as shown by the item (j) in FIG. 9. As in the case of item (i) in FIG. 2, a non-current carrying time $T_0$ will be provided and a mean voltage impressed on the load may be regulated to an efficiency of the load. Items (k), (1), (m), (n) in FIG. 9 indicate output waveforms when outputs of 40 Hz, 30 Hz, 24 Hz, 20 Hz are obtained, respectively.

To obtain various frequency outputs shown in FIG. 9, a combination of waveforms in one cycle of the utilized AC power source may be changed. FIG. 4 is an enlarged view of the one cycle (see item (i) in FIG. 2), wherein if a current carrying time to the load is $T_1$ and a non-current carrying time is $T_0$ (the aforementioned time), then the one cycle can be divided into $T_1 \rightarrow T_0 \rightarrow T_1 \rightarrow T_1 \rightarrow T_0 \rightarrow T_1$, and a combination of ON states of the photo-coupler at each time can be classified into I mode→II mode→III mode→IV mode→III mode (for each mode status refer to FIG. 5). The illustration is that for obtaining 60 Hz output, however, when compared with other frequency outputs shown in FIG. 9, the time is repeated all the time as $T_1 \rightarrow T_0 \rightarrow T_1$ notwithstanding that the output frequency varies. Accordingly, different frequency outputs will be obtainable by changing an output order of I mode to IV mode. For example, when obtaining 40 Hz output, the mode comes in I→II→I→I→II→III→III→IV→III (for one period), while the time is as $T_1 \rightarrow T_0 \rightarrow T_1 \rightarrow T_1 \rightarrow T_0 \rightarrow T_1 \rightarrow T_1 \rightarrow T_0 \rightarrow T_1$ (for one period).

In the invention, since arms with a cathode terminal of the thyristor connected to a collector terminal of the transistor are connected in parallel into two circuits, and a single-phase load is connected between nodes of the cathode terminal and the collector terminal of each arm, a carried current controlled by the thyristor is chopped by the transistor and an output of the half cycle can be divided at every plural time. Accordingly, an operation similar to the case where the circuit is configured entirely by transistors is obtainable even from using thyristors, and thus the cost can be significantly reduced from using the thyristors, an independent power source for ignition circuit becomes unnecessary as compared with the transistors, thus simplifying the circuit.

Figure 10:
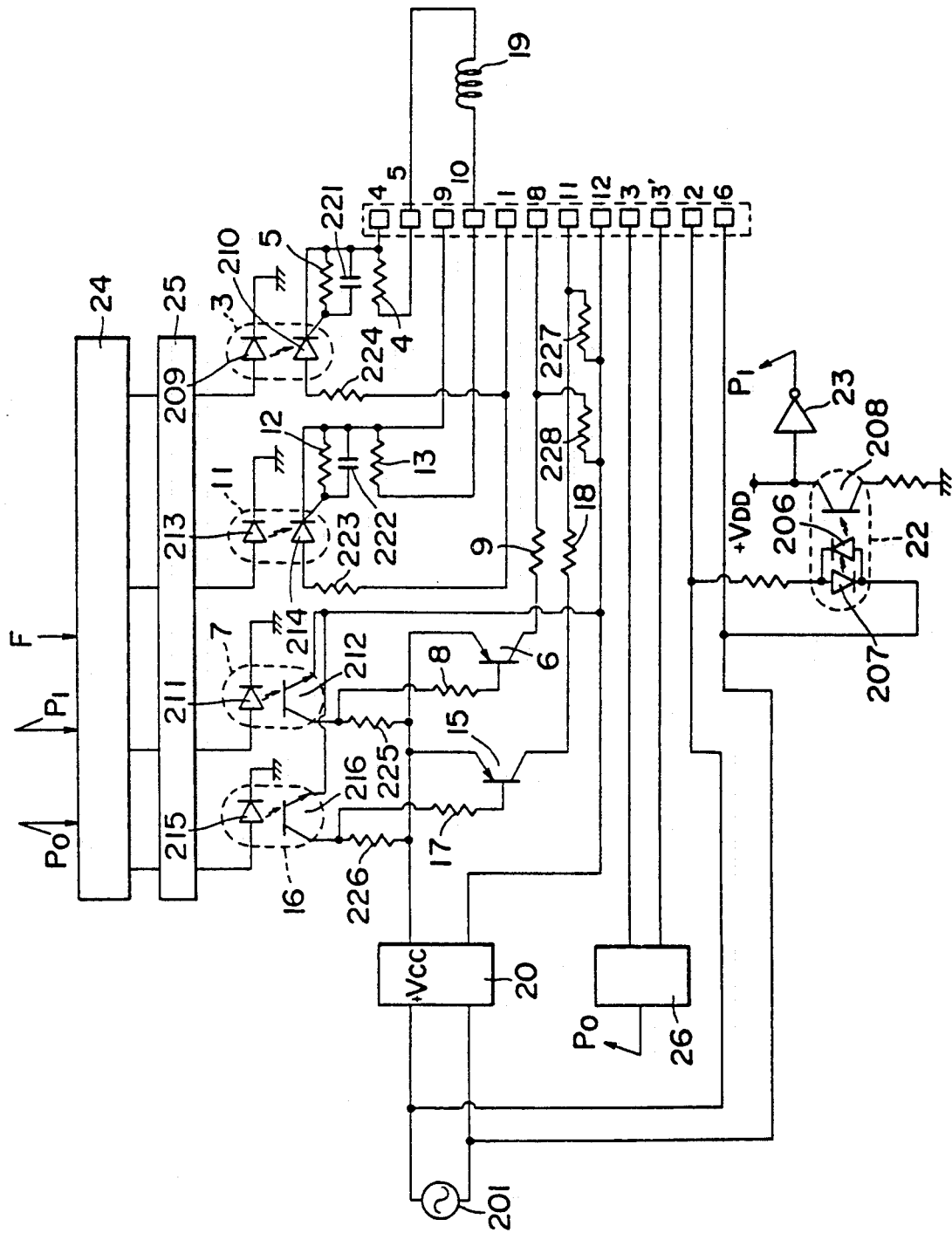
FIG. 10 is an electric circuit diagram representing the circuit shown in FIG. 1 by means of the molded device shown in FIG. 11 or 13.

FIG. 10 shows an electronic circuit which has some change in layout from that of FIG. 2. In FIG. 10, the thyristors 1, 10, the transistors 2, 14, the full-wave rectifying circuit 21 and a temperature sensor 28 which are shown in FIG. 11 are molded and separated within a single module 27. A temperature protecting part 26 outputs a signal to the controlling part 24 to a current carrying to the load when the temperature detected by the temperature sensor 28 connected through terminals 3, 3' reaches a predetermined temperature.

Figure 13:
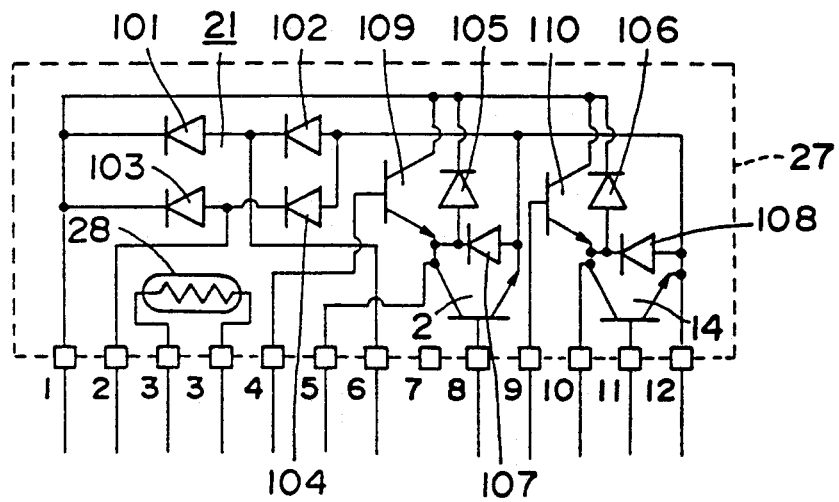
FIG. 13 is a frequency conversion circuit diagram according to another embodiment of the present invention.

FIG. 11 is an internal circuit diagram of the molded device 27 connected to terminals 1 through 12 shown in FIG. 10. The thyristors 1 and 10 can be replaced by transistors 1', 10' as illustrated in FIG. 13. In FIGS. 11 and 13, reference numerals 101-104 represent rectifying diodes, numerals 105-108 represent reverse-blocking diodes, and numerals 109 and 110 represent transistors.

Figure 12:
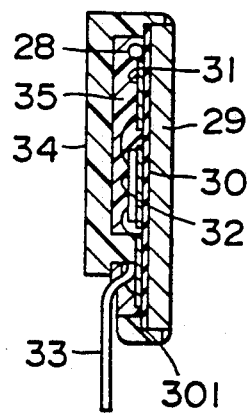
FIG. 12 is a sectional view taken along XII—XII in FIG. 11 showing the molded device.

FIG. 12 is a longitudinal sectional view of the molded device 27 shown in FIG. 11. In FIG. 12, the device 27 has an insulation layer 30 on an aluminum substrate 29, a wiring pattern 31 on the insulation layer 30, a chip 32 of the transistor, a lead wire 33 extending outwardly for connection with external electrical elements an outer frame 34 of a suitable synthetic resin, a terminal 301 and a filler 35 of a suitable synthetic resin filled in a space between the outer frame 34 and the aluminum substrate 29.

While the invention has been described in the specification and illustrated in the drawings with reference to preferred embodiments of the single-phase frequency conversion circuit device, it will be understood by those skilled in the art that various changes may be made and equivalents may be substituted for elements thereof in accordance with applications and technical field to be applied without departing from the scope of the invention. In addition, many modifications may be made to adapt a particular situation or material to the teachings of the invention without departing from the essential scope thereof. Therefore, it is intended that the invention will not be limited to the particular embodiment illustrated by drawings contemplated for carrying out the present embodiments falling within the description of the appended claims.

What is claimed is:

1. A conversion apparatus having a bridge circuit using fast switching transistors for PWM and slow switching thyristors for a fundamental frequency and supplying to a load an output AC power having a frequency which is different from a frequency of an input AC power supplied thereto, said inverter comprising:

a rectifying circuit for rectifying a full wave of the input AC power and for providing a rectified output of pulsating power, transistors for ON/OFF switching, said transistors each having a collector terminal, an emitter terminal and a base terminal for switching ON/OFF an electric current from said collector terminal to said emitter terminal, thyristors having an ON/OFF switching speed slower than a switching speed of said transistors, said thyristors each having an anode terminal, a cathode terminal, and a gate terminal for switching ON/OFF an electric current from said anode terminal to said cathode terminal, a plurality of bridge circuit arms each comprising one of said transistors and one of said thyristors, said collector terminal of said one of said transistors being connected to said cathode terminal of said one of said thyristors, said emitter terminal of said one of said transistors being connected to a negative side of said rectified output from said rectifying circuit, said anode terminal of said one of said thyristors being connected to a positive side of said rectified output from said rectifying circuit, said plurality of bridge circuit arms being connected in parallel to each other to from the bridge circuit, controlling means for supplying an electric signal to said gate terminal of said thyristors and for supplying an electric signal to said base terminal of said transistors so as to supply the AC output power to said load in accordance with a desired frequency, wherein said transistors repeatedly switch between ON and OFF states while said thyristors are in an ON state, and, a zero cross signal generator for generating a zero cross signal at each half cycle of the input AC power supplied thereto, said controlling means further comprising means for dividing a pulsating power during a period of time between said zero cross signal and a subsequent zero cross signal into plural power portions in accordance with the period of time, and means for changing a polarity of each of said plural power portions to said load in accordance with the desired frequency.

* * * * *